United States Patent
Hossain

(10) Patent No.: US 7,739,643 B2
(45) Date of Patent: Jun. 15, 2010

(54) CROSSTALK NOISE REDUCTION CIRCUIT AND METHOD

(75) Inventor: Rozak Hossain, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 207 days.

(21) Appl. No.: 11/964,180

(22) Filed: Dec. 26, 2007

(65) Prior Publication Data
US 2008/0100367 A1 May 1, 2008

Related U.S. Application Data

(62) Division of application No. 10/901,694, filed on Jul. 29, 2004, now Pat. No. 7,337,419.

(51) Int. Cl.
*G06F 17/50* (2006.01)

(52) U.S. Cl. .......... 716/6; 716/4; 716/5; 327/309; 327/379; 327/382; 327/389; 326/26; 326/30

(58) Field of Classification Search ............ 716/4–6; 327/309, 379, 382, 389; 326/26, 30
See application file for complete search history.

(56) References Cited

U.S. PATENT DOCUMENTS

| | | | | |
|---|---|---|---|---|
| 5,900,766 A | * | 5/1999 | Naffziger et al. ............ | 327/382 |
| 6,201,431 B1 | * | 3/2001 | Allen et al. .................. | 327/379 |
| 6,414,542 B2 | * | 7/2002 | Lin et al. ..................... | 327/565 |
| 6,448,807 B1 | * | 9/2002 | Ahsanullah .................. | 326/30 |
| 6,925,624 B2 | * | 8/2005 | Komoda ...................... | 716/10 |
| 7,116,126 B2 | * | 10/2006 | Tomsio et al. ................ | 326/26 |
| 2007/0013429 A1 | * | 1/2007 | Katoch et al. ............... | 327/309 |

* cited by examiner

*Primary Examiner*—Naum B Levin
(74) *Attorney, Agent, or Firm*—Lisa K. Jorgenson; Renee Michelle Laveque

(57) ABSTRACT

In a semiconductor device, a method for reducing the effect of crosstalk from an aggressor line to a victim line begins with sensing the occurrence of a voltage change on the aggressor line that can induce a voltage pulse having a pulse magnitude that exceeds a pulse threshold on the victim line. The induced voltage pulse is counteracted by coupling the victim line to a counteracting voltage source. After a predetermined delay period, the coupling of the counteracting voltage source is removed from the victim line. The voltage change on the aggressor line my be sensed from a node connected to either the aggressor line or the victim line. A rising induced pulse is counteracted by coupling the victim line to a more negative voltage source, and a falling induced pulse is counteracted by coupling the victim line to a more positive voltage source.

12 Claims, 4 Drawing Sheets

CROSSTALK NOISE REDUCTION CIRCUIT AND METHOD

This is a divisional of application Ser. No. 10/901,694 filed on Jul. 29, 2004, now U.S. Pat. No. 7,337,419, issued Feb. 26, 2008, the entire disclosure of which is incorporated into this application by reference and to which the instant application claims priority.

BACKGROUND OF THE INVENTION

1. Field of the Invention

The present invention relates generally to circuits and methods in integrated circuits, and more specifically to circuits and methods for reducing the effects of crosstalk noise in integrated circuits.

2. Description of the Prior Art

As integrated circuits (ICs) become faster, smaller, and more complex, signal lines in the integrated circuit are carrying high-speed signals in densely routed circuits where the conditions are ideal for producing crosstalk noise. Crosstalk occurs when a signal from one conductor leaks to another. Strong crosstalk noise can be generated because of tight electrical coupling of two or more signal lines in a high-speed and high-density application.

Crosstalk is induced through three coupling mechanisms: capacitive, inductive, and radiative. Capacitive coupling occurs when conductors are so close that the capacitance becomes large enough to couple significant energy from one line to another. Most of the wire capacitance is to parallel neighboring wires in the same layer, where wires can be routed side-by-side on a semiconductor wafer for relatively long distances. Inductive coupling occurs when two signal lines are coupled by mutual inductance. Radiative coupling is essentially a self-induced electromagnetic interference (EMI) disturbance.

In current deep submicron integrated circuit manufacturing technologies, a large percentage of the total capacitance of a wire is the capacitance of coupling to other conductors. This coupling can lead to large spikes being induced on victim lines when an aggressor line switches. The spikes are particularly severe when two lines run adjacent to each other for long distances, as occurs when buses are routed.

Crosstalk is deleterious to integrated circuits for several reasons. First, the induced spike can sometime cause a gate on the victim line to flip or change logical states. This leads to functional faults in dynamic logic circuits. In static logic circuits, such glitches can induce new, longer critical paths in the design, slowing down the function of the part.

Second, even if the gate on the victim line does not flip, it can slow down a signal that is transitioning in the opposite direction from the induced spike on the victim line. This is because the gate driving the victim line needs more time to remove the induced charge from the crosstalk pulse. With process scaling, crosstalk will become a more serious problem as a greater proportion of a line's capacitance comes from coupling with other conductors.

FIG. 1 illustrates a known solution for reducing crosstalk noise on coupled lines by inserting inverters between the coupled lines. In this solution, inverters 40 are placed between cross coupled lines so that if a voltage on aggressor line 20 is rising, the coupled victim line 26 will be pulled down, and vice versa. This technique reduces the size of the voltage spike due to crosstalk.

The solution shown in FIG. 1 has its disadvantages, however, as the inverters consume power whenever aggressor line 20 and victim line 26 are at the same logic value. If the aggressor and victim lines are driven by domino cells, lines are at the same voltage during every cycle when the gates are in precharge. Additionally, cross coupled inverters 40 can increase the delay for a line to switch since they form a feedback loop that needs to be overcome whenever a line changes.

Other solutions used in industry to reduce coupling effects include passive schemes, such as shielding and greater line spacing. Both of the these techniques are effective, but they require additional area on the wafer, which increases the cost of the part. In addition, circuit blocks with a lot of wiring congestion may become unroutable if a large number of wires must have wider spacing or shielding. This is because shielding and spacing both require extra routing tracks. For a long, wide bus, in particular, shielding or spacing every line from every other one would consume a large area on the wafer.

Another approach for reducing crosstalk uses simultaneous redundant switching on an extra conductor. This approach also has an area penalty, which may make it unsuitable for some designs.

Therefore, it should be apparent that there is a need for an improved method and apparatus that reduces the effects of crosstalk noise, consumes less power, has a small speed penalty for signal propagation, requires a smaller area on the wafer, and has performance similar to or greater than shielding and increased line spacing.

SUMMARY OF THE INVENTION

The present invention provides a method in a semiconductor device for reducing the effects of crosstalk from an aggressor line to a victim line. The process begins with sensing the occurrence of a voltage change on the aggressor line that can induce a voltage pulse having a pulse magnitude that exceeds a pulse threshold on the victim line. The induced voltage pulse is counteracted by coupling the victim line to a counteracting voltage source. After a predetermined delay period, the coupling of the counteracting voltage source is removed from the victim line. The voltage change on the aggressor line may be sensed from a node connected to either the aggressor line or the victim line. A rising induced pulse is counteracted by coupling the victim line to a more negative voltage source, and a falling induced pulse is counteracted by coupling the victim line to a more positive voltage source.

The present invention further provides a circuit in an integrated circuit for reducing the effects of crosstalk. An aggressor signal path extends from a first node to a second node. A victim signal path is adjacent to the aggressor signal path. A first transistor has a control input coupled to an aggressor line transition sensing node, and has a first terminal coupled to the victim signal path. The first transistor connects the victim signal path to a counteracting voltage source. The aggressor line transition sensing node is electrically coupled to signals on the aggressor line, either directly coupled by a connection to the aggressor signal path, or indirectly coupled by a connection to the victim signal path. A delay circuit has an input connected to the aggressor line transition sensing node, and a delay output signal. A second transistor has a control input coupled to the delay output signal, a first terminal coupled to a second terminal of the first transistor, and a second terminal connected to the counteracting voltage source.

BRIEF DESCRIPTION OF THE DRAWINGS

For a more complete understanding of the present invention, and the advantages thereof, reference is now made to the following descriptions taken in conjunction with the accompanying drawings, in which like numbers designate like parts, and in which.

DESCRIPTION OF THE PREFERRED EMBODIMENTS

Figure 2:
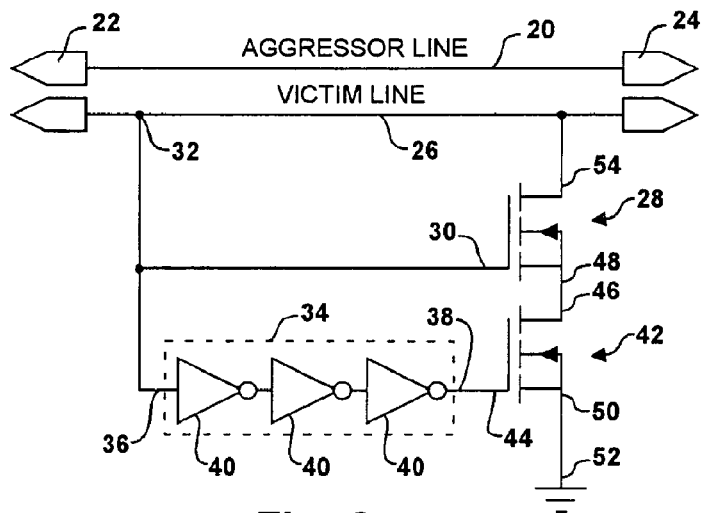
FIG. 2 is a schematic diagram of a first embodiment of a circuit for reducing the effect of crosstalk in accordance with the method and apparatus of the present invention.
Figure 3:
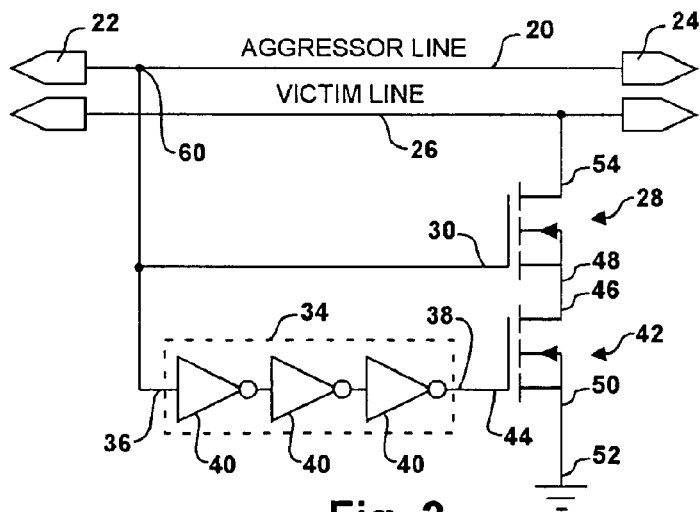
FIG. 3 is a schematic diagram of a second embodiment of a circuit for reducing the effect of crosstalk in accordance with the present invention.

With reference now to the drawings, the circuits shown in FIGS. 2-5 are designed to reduce the effects of crosstalk, which causes either a positive-going or a negative-going pulse on victim line 26. The circuit in FIGS. 2 and 3 are designed to reduce the effects of a crosstalk positive-going pulse on victim line 26, and the circuits shown in FIGS. 4 and 5 reduce the effects of a crosstalk negative-going pulse on victim line 26. The circuits in FIGS. 2 and 3 differ in the way they sense a trigger event on aggressor line 20 that would cause, or has caused, crosstalk on victim line 26. Circuits in FIGS. 4 and 5 similarly differ in the sensing of the trigger event.

Referring now to FIG. 2, there is depicted a schematic diagram of a circuit for reducing the effect of crosstalk in accordance with the present invention. As illustrated, aggressor line 20 represents a signal path in an integrated circuit extending from first node 22 to second node 24. Victim line as 26 has a path close to aggressor line 20, and is close enough over a large enough distance to be electrically coupled to victim line 26, wherein a signal transition on aggressor line 20 can cause crosstalk noise on victim line 26.

First transistor 28 has control input 30 coupled to aggressor line transition sensing node 32, and first terminal 54 connected to victim line 26. First transistor 28 is preferably implemented with an N-channel field effect transistor, such as a metal-oxide semiconductor (MOS) field effect transistor (FET) (MOSFET). In alternate embodiments, transistor 28 may be implemented with another type of transistor, such as a NPN bi-polar junction transistor (BJT). Control input 30 is preferably the gate terminal of a MOSFET, or alternatively the base of a BJT. First terminal 54 is preferably the drain terminal of a MOSFET, or alternatively the collector of a BJT. The technique of the present invention may be implemented with various transistors of different speeds, made using different processes.

Aggressor line transition sensing node 32 is a point where voltage is sampled, or analyzed, for determining whether and when to switch first transistor 28 into a conductive state to reduce the effects of crosstalk. In the embodiment shown in FIG. 2, aggressor line transition sensing node 32 is a conductor connected to victim line 26, on which a voltage pulse may be induced by crosstalk in response to a voltage transition on aggressor line 20. In FIG. 3, aggressor line transition sensing node 60 is a conductor connected directly to aggressor line 20, which provides a different location for sensing the event that causes the crosstalk noise. Note that except for the location of the sensing, the circuits of FIGS. 2 and 3 operate in a similar manner.

In operation, first transistor 28 has a threshold associated with control input 30, where a voltage that exceeds the threshold puts first transistor 28 in a conductive state. In a preferred embodiment, the threshold is the gate turn-on threshold of a MOSFET, which is typically about 25% of the supply voltage.

Delay circuit 34 has input 36 connected to aggressor line transition sensing node 32, and an output 38. Delay circuit 34 may be implemented with a plurality of inverters 40 connected in series, wherein a signal at input 36 is delayed by a number of gate delays, and output as an inverted signal at output 38. Delay circuit 34 preferably has a delay substantially equal to a duration of a pulse induced on the victim line by a voltage transition on the aggressor line. This delay may be substantially equal to an amount of time the induced voltage pulse exceeds a pulse threshold on the victim line. The delay will vary depending on the speed of the design and the fabrication process, but one or three inverter delays should be adequate for most applications. This delay limits the amount of time the circuit operates to counteract the effects of crosstalk noise. To conserve power and reduce signal propagation delays, the circuit should operate only as long as it takes to counteract the charge induced by crosstalk on the victim line. Note that the crosstalk reducing circuitry of the present invention has less drive capacity than the logic drive circuits driving the victim line, which allows the circuit of the present invention to fight crosstalk noise, but not overpower logic drive circuits, or supersede a driven logical value on the victim line.

Second transistor 42 has control input 44 connected to output 38 of delay circuit 34. Second transistor 42 also has first terminal 46 connected to second terminal 48 of first transistor 28. Second terminal 50 of second transistor 42 is connected to counteracting voltage source 52. In the embodiment of FIG. 2, counteracting voltage source 52 is a zero-volt voltage source, implemented by a connection to ground or zero volts, which is a voltage source that may be used to counteract a positive-going pulse. Other voltages that are more negative than the positive-going pulse may also be used. First and second transistors 28 and 42 are connected in series and work together to form a pull-down circuit.

With reference now to FIG. 3, there is depicted the second embodiment of the present invention. This embodiment is the same as that shown in FIG. 2 except for the location of the node used to sense the occurrence of a voltage change on the aggressor line that can induce a voltage pulse having a pulse magnitude that exceeds a pulse threshold on the victim line. As mentioned above, this embodiment has aggressor line transition sensing node 60 connected to aggressor line 20, rather than victim line 26 as shown in the embodiment of FIG. 2.

Figure 1:
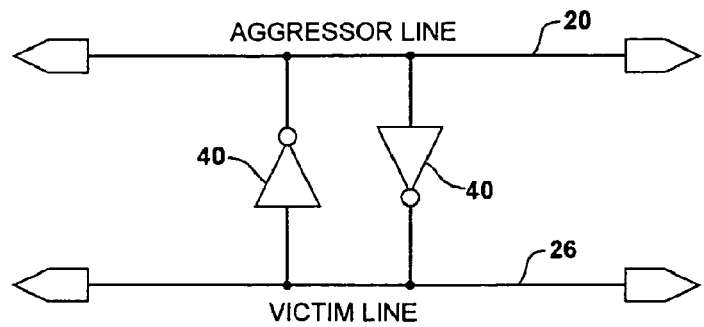
FIG. 1 is a schematic diagram of a prior art circuit for controlling the effects of crosstalk.

FIG. 3 provides a more powerful and elegant solution for reducing crosstalk effects. In this embodiment, victim line 26 is only pulled-down when aggressor line 20 switches. This circuit is quicker to counteract the induced pulse, and victim line 26 is only delayed if aggressor line 20 rises at the same time. As can be seen, this solution has some advantages over the solution given in FIG. 1. Simulations have shown that the circuit of FIG. 3 can reduce coupled noise pulses with a very low delay penalty.

Figure 4:
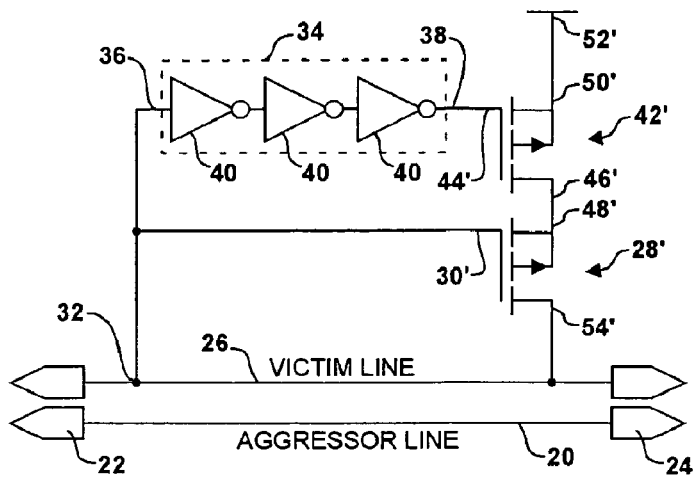
FIG. 4 is a schematic diagram of a third embodiment of a circuit for reducing the effect of crosstalk in accordance with the present invention.
Figure 5:
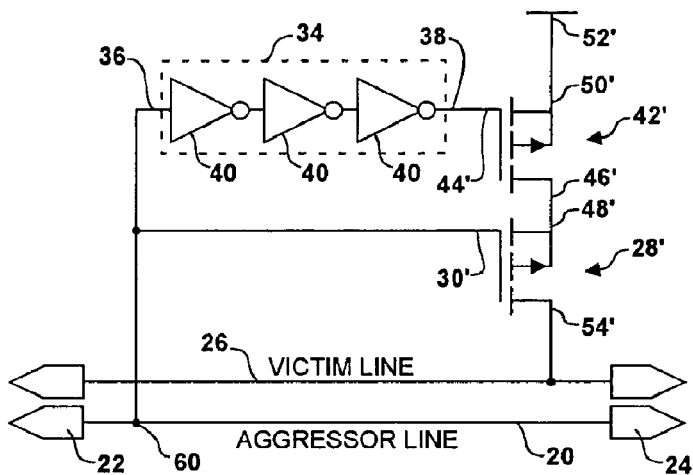
FIG. 5 is a schematic diagram of a fourth embodiment of a circuit for reducing the effect of crosstalk in accordance with the present invention.

The third and fourth embodiments of the present invention shown in FIGS. 4 and 5 are similar to the first and second embodiments shown in FIGS. 2 and 3, except that the polarity of counteracting voltage source and the transistor types are different in order to counteract a negative-going crosstalk pulse. In FIGS. 4 and 5, first and second transistors 28' and 42' are P-channel transistors, and terminals 46', 48', 50', and 54' are the corresponding terminals of the P-channel transistors. Counteracting voltage source 52' is a more positive voltage source, preferably a voltage source equal to, or close to, the supply voltage. First and second transistors 28' and 42' are connected in series and work together to form a pull-up circuit.

Figure 7:
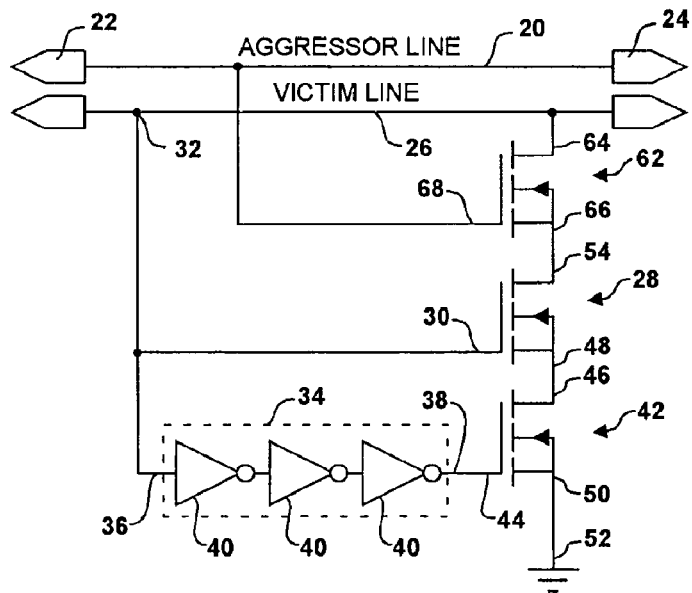
FIG. 7 is a schematic diagram of a fifth embodiment of a circuit for reducing the effect of crosstalk in accordance with the present invention.
Figure 8:
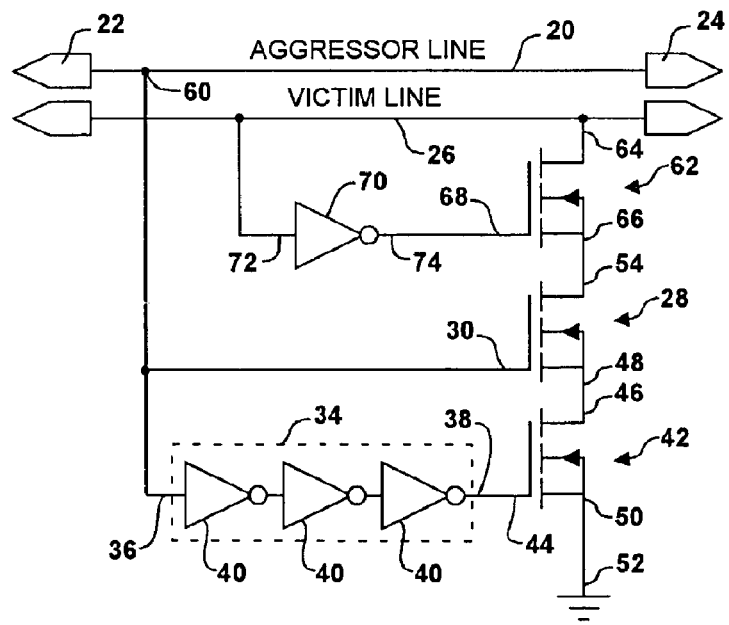
FIG. 8 is a schematic diagram of a sixth embodiment of a circuit for reducing the effect of crosstalk in accordance with the present invention.
Figure 9:
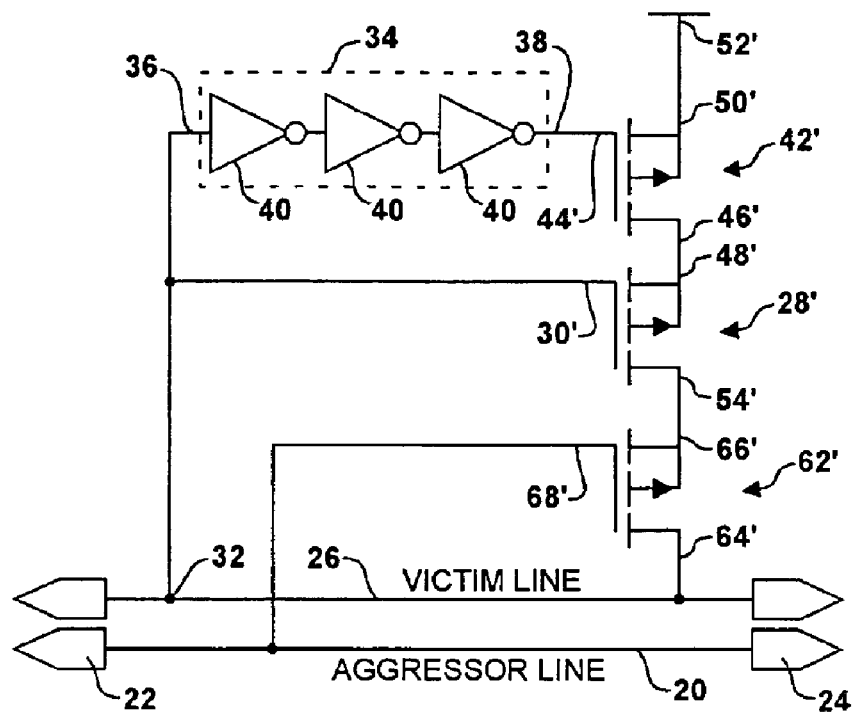
FIG. 9 is a schematic diagram of a seventh embodiment of a circuit for reducing the effect of crosstalk in accordance with the present invention.
Figure 10:
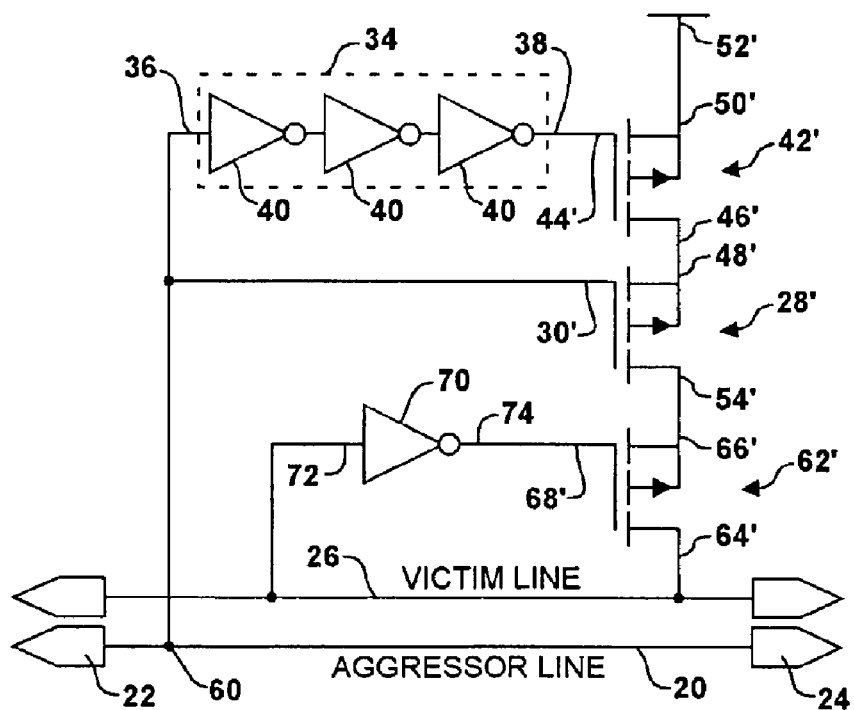
FIG. 10 is a schematic diagram of a seventh embodiment of a circuit for reducing the effect of crosstalk in accordance with the present invention.

In another embodiment of the present invention, both the victim and aggressor lines can be sensed to control the operation of the crosstalk suppression circuit. Notice that the circuit of FIG. 2 opposes, for a short duration, the change from a 0 state to a 1 state on victim line 26. This has the disadvantage of slowing down the victim line transition and burning power, even when crosstalk is absent. The circuit in FIG. 3 is a bit more selective in that the circuit is active, or turned on, only when aggressor line 20 switches. Unfortunately, this means that if victim line 26 is at a logic value 1, and should remain there, the noise reducing circuit tries to bring it to 0 for a short while, causing power to be burned. The embodiments shown in FIGS. 7 and 8 represent an extension of the circuits shown in FIGS. 2 and 3, respectively. The embodiments shown in FIGS. 9 and 10 represent an extension of the circuits shown in FIGS. 4 and 5, respectively.

In FIG. 7, the circuit is only enabled if aggressor line 20 is at a logic 1, or high level. This helps since if victim line 26 has crosstalk noise, it must be due to aggressor line 20 going high. Still, this circuit could burn unnecessary power if aggressor line 20 was already high and then victim line 26 switched high.

As shown in FIG. 7, transistor 62 has first terminal 64 connected to victim line 26 and second terminal 66 connected to first terminal 54 of first transistor 28. Control input 68 is connected to aggressor line 20. Transistor 62 enables the crosstalk reduction circuit by sensing or detecting that aggressor line 20 is in a transition from low to high, or is currently in a high state.

FIG. 8, is a variant on the FIG. 3 scheme. In this embodiment, aggressor line 20 causes the circuit to turn on when it switches from 0 to 1, if and only if victim line 26 is at a 0 state, which is a state when crosstalk could affect it. The circuit is not enabled or on when victim line 26 is already in a 1 state.

As shown in FIG. 8, transistor 62—which has first terminal 64 connected to victim line 26 and second terminal 66 connected to first terminal 54 of first transistor 28—has control input 68 connected to inverter 70. Inverter 70 has input 72 and output 74. Output 74 is connected to control input 68. Input 72 is connected to victim line 26. Inverter 70 and transistor 62 enables the crosstalk reduction circuit when crosstalk is sensed or detected on victim line 26 is in a transition from low to high, or is currently in a high state.

FIGS. 9 and 10 show analogous modifications of the pull up circuits shown in FIGS. 4 and 5, which circuits reduce the effects of the type of crosstalk noise characterized by a negative-going noise pulse.

In the present invention, first transistor 28 and second transistor 42 are connected in series, with first transistor 28 connected to victim line 26. In alternate embodiments of the present invention, the order of these two transistors may be switched, where second transistor 42 is connected to victim line 26. While this alternate circuit is a functionally equivalent circuit—where the order of two series elements has been changed—there are some minor differences in how fast the circuit will turn on and off. Experienced designers may modify the stacking arrangement based on design needs. The series order of transistors 28' and 42' in FIGS. 4 and 5 may also be swapped. The electrical path through any series-connected transistors between victim line 26 and counteracting voltage source 52 or 52' may be referred to as a transistor conducing path, which is used to conduct current to counteract crosstalk noise under the control of the conducting or non-conducting states of the series-connected transistors.

Figure 6:
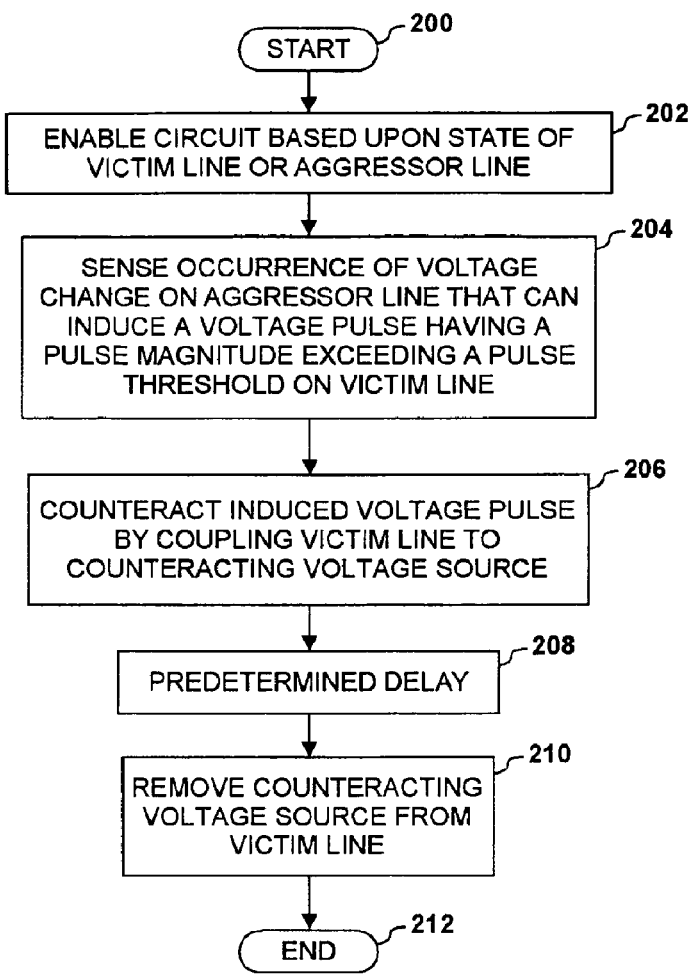
FIG. 6 is a high-level logical flowchart of the process for reducing the effect of crosstalk in accordance with the method and apparatus of the present invention.

With reference now to FIG. 6, there is depicted a high-level logical flowchart that illustrates the method and operation of the present invention. As shown, the process begins at block 200, and thereafter passes to block 202 wherein the process enables the crosstalk reduction circuit based upon state of the victim line or the aggressor line. As shown in FIGS. 7-10, third transistor 62 is in series with first and second transistors 28 and 42. Thus, when third transistor 62 is in the non-conducting state, the crosstalk reduction circuit cannot connect victim line 20 to a counteracting voltage source.

In the embodiments shown in FIGS. 7 and 9, third transistor 62 is connected to aggressor line 20. Thus, the circuit is enabled when aggressor line 20 is transitioning in a direction that will cause crosstalk. The circuit is disabled when aggressor line 20 is in a state that cannot cause crosstalk noise of the type counteracted by the counteracting voltage source. For example, in FIG. 7, the direction that will cause crosstalk is from a low voltage to a high voltage. The circuit is disabled when aggressor line 20 is in a low state, a state that cannot cause positive-going crosstalk noise, which is counteracted by a low counteracting voltage source. In FIG. 9, the direction that will cause crosstalk is from a high voltage to a low voltage. The circuit is disabled when aggressor line 20 is in a high state, a state that cannot cause negative-going crosstalk noise, which is counteracted by a high counteracting voltage source.

Note that unfortunately crosstalk reduction circuit will also be enabled when aggressor line 20 is in a steady state at a voltage toward which such transitions are approaching. For example, in FIG. 7, the circuit is enabled and activates when aggressor line 20 is at a steady state high voltage and victim line 26 makes a logical transition from 0 to 1. In FIG. 9, the circuit is enabled and activates when aggressor line 20 is at a steady state low voltage and victim line 26 makes a logical transition from 1 to 0.

In the embodiments shown in FIGS. 8 and 10, third transistor 62 is connected, through inverter 70 to victim line 26. Thus, the circuit is enabled when victim line 26 is in a state that is vulnerable to crosstalk noise. Therefore it follows that the circuit that couples the victim line to a counteracting voltage source is disabled when the victim line is in a state that is not vulnerable to crosstalk noise of the type counteracted by the counteracting voltage source. For example, in the circuit of FIG. 8, the state that is vulnerable to crosstalk noise is a low voltage state, where victim line 26 may be affected by a 0-to-1 transition on aggressor line 20, and the voltage that counteracts the positive-going crosstalk noise is a low voltage. In the circuit of FIG. 10, the state that is vulnerable to crosstalk noise is a high voltage state, where victim line 26 may be affected by a 1-to-0 transition on aggressor line 20, and the voltage that counteracts the negative-going crosstalk noise is a high voltage.

Next, as depicted at block 204, the process senses the occurrence of a voltage change, or transition, on an aggressor line that can induce a voltage pulse having a pulse magnitude that exceeds a pulse threshold on a victim line. The input to the sensing step may use either a direct connection to the aggressor line to sense a voltage change, or it may use an indirect connection, or an electrical coupling, to sense changes on the aggressor line, wherein, for example, the sensing input is connected to the victim line. The direct sensing connection to the aggressor line, where the aggressor line transition sensing node is directly connected to the aggressor line, is shown at reference numeral 60 in FIGS. 3, 5, 8, and 10. The indirect sensing connection to the aggressor line, where the aggressor line transition sensing node is connected to a line effected by transitions on the aggressor line, is shown at reference numeral 32 in FIGS. 2, 4, 7, and 9.

Voltage transitions that can induce a voltage pulse on the victim line typically include transitions associated with changes in digital data on a data line. The pulse threshold on the victim line is preferably a voltage threshold of a control input of a transistor, such as, for example, the gate threshold of a MOSFET, which is the voltage needed to change the transistor from the non-conducting state to the conducting state. In the embodiments of the invention shown in FIGS. 2-5 and 7-10, the pulse threshold is measured by the control input threshold of first transistor 28 and 28', which is connected to either victim line 26 for indirect sensing or aggressor line 20 for direct sensing.

Once the voltage change on the aggressor line has been sensed, the process counteracts the induced voltage pulse by coupling the victim line to a counteracting voltage source, as depicted at block 206. This step is preferably implemented by changing first transistor 28 or 28' to the conductive state to connect victim line 26 to a counteracting voltage source to reduce the total charge coupled on to victim line by an aggressor. When the induced voltage pulse is a positive-going pulse, the victim line is coupled to a voltage source more negative than the pulse to reduce the charge on the victim line. A positive-going pulse is preferably counteracted by connecting to a voltage source near zero volts.

For example, in the embodiments shown in FIGS. 2 and 3, which counteract a positive-going pulse, victim line 26 is connected to a more negative counteracting voltage source by setting first transistor 28 to conduct, thereby connecting victim line 26 to counteracting voltage source 52 through the series connected second transistor 42. Counteracting voltage source 52 has a voltage of substantially zero volts. Second transistor 42 is initially in the conductive state and connected to counteracting voltage source 52, which is ground or zero volts. In FIGS. 2 and 3, second transistor 42 is preferably an n-channel MOSFET, and first terminal 46 is the drain of the MOSFET.

Similarly, in the embodiments shown in FIGS. 4 and 5, which counteracts a negative-going pulse, victim line 26 is connected to a more positive counteracting voltage source through first terminal 46' of second transistor 42', which has a voltage of substantially zero volts because second transistor 42' is initially in the conductive state and connected to counteracting voltage source 52', which is the positive supply voltage. In this embodiment for counteracting a negative-going pulse, second transistor 42' is preferably a p-channel MOSFET, and first terminal 46' is the drain of the MOSFET.

Once the counteracting voltage source is connected to the victim line, the process delays for a predetermine time, as illustrated in block 208. In a preferred embodiment, this delay is implemented in delay circuit 34 shown in FIGS. 2-5 and 7-10. Delay circuit 34 may include an inverting delay module having a series of inverter circuits 40 having typical propagation delays. A signal at input 36 appears at output 38 after a predetermined number of gate delays. The signal at output 38 is also inverted from input 36. In FIGS. 2 and 3, output 38 is initially high, which places second transistor 42 in the conductive state so that the counteracting voltage is present on first terminal 46, where it is ready to be connected to victim line 26. In FIGS. 4 and 5, output 38 is initially low, placing second transistor 42', a P-channel transistor, in the conductive state.

Delay circuit 34 preferably has a delay substantially equal to a duration of a pulse induced on the victim line by a voltage transition on the aggressor line.

After the delay period, the process removes the counteracting voltage source from the victim line, as illustrated in block 210. In a preferred embodiment, counteracting voltage source 52 or 52' is removed or disconnected from victim line 26 by switching second transistor 42 or 42' to the non-conductive state. As shown in FIGS. 2 and 3, output 38 is coupled to control input 44 of second transistor 42. In these embodiments for counteracting positive-going pulses, input 36 is initially low and output 38 is high, setting second transistor 42 in the conductive state. As the pulse threshold is exceeded, and the positive-going pulse is sensed and the delay period has passed, output 38 switches low, which sets second transistor 42 in the non-conductive state to remove the counteracting zero-volt source 52 from victim line 26. The embodiment of FIGS. 4 and 5, which reduces the effects of a negative-going pulse, operates in a similar manner, considering the reversed polarities.

After removing the counteracting voltage source, the process for reducing the effects of crosstalk ends, as shown at block 212. Persons skilled in the art should recognize that this process may be performed in several locations, on several different victim lines, within an integrated circuit. These processes may be performed simultaneously, whether or not the steps are step-for-step synchronized, in the several locations across the integrated circuit where the invention is implemented. Descriptions above of FIGS. 2-5 may be analogously applied to the circuits shown in FIGS. 7-10.

The invention disclosed above is a set of circuits for reducing the total charge coupled on to a victim line by an aggressor line. The circuit only begins to operate when glitches or induced pulses are sensed, and then only operates for a short period. This limited operation limits the power consumption and the interconnect delay overhead of the circuit. The continuous feedback problem present in the prior art is also eliminated.

The invention counters the effect of a spike by introducing a pull-down (or pull-up) current in the opposite direction of the spike. The pull-down circuit does not prevent the victim line from rising, it only ensures that an additional charge must be applied to the line before it will rise. The victim line will only rise to about a threshold voltage that will activate the pull-down circuit, which is a voltage less than a threshold for producing a data change or other digital logic change.

Note that the circuits of the present invention may be used individually, or in pairs where one circuit (from either FIG. 2 or 3) reduces the effect of a positive-going pulse while another circuit (from either FIG. 4 or 5) reduces the effect of a negative-going pulse. Circuits of the present invention may be used as needed, where needed. The placement of the noise suppression circuitry will depend on the location of the greatest noise and where the noise tolerance is least. For example, if the aggressor occurs in one part of a long line, the crosstalk suppression circuitry should be close to the crosstalk source. Also one crosstalk suppressing circuit may be used to protect multiple possible victim lines or victim cells, instead of one. When more than one cell is protected, the noise suppression circuitry may be placed closest to the most vulnerable victim cell.

The foregoing description of a preferred embodiment of the invention has been presented for the purpose of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method in a semiconductor device for reducing the effect of crosstalk from an aggressor line to a victim line, the method comprising:
    an aggressor line transition sensing node of the semiconductor device sensing the occurrence of a voltage change on the aggressor line that can induce a voltage pulse having a pulse magnitude that exceeds a pulse threshold on the victim line;
    counteracting the induced voltage pulse by coupling the victim line to a counteracting voltage source; and
    after a predetermined delay period from the sensing of the voltage change determined by a delay element coupled to the aggressor line transition sensing node, removing the coupling of the counteracting voltage source from the victim line,
    wherein removing the coupling of the counteracting voltage source from the victim line after the predetermined delay period further comprises switching a transistor that couples the counteracting voltage source to the victim line to a nonconductive state after a predetermined number of gate delays following the sensing of the voltage change on the aggressor line.

2. The method for reducing the effect of crosstalk according to claim 1 wherein sensing the occurrence of a voltage change on the aggressor line that can induce a voltage pulse having a pulse magnitude that exceeds a pulse threshold on the victim line further comprises sensing a voltage change on the aggressor line that can induce a voltage pulse having a pulse magnitude that exceeds a pulse threshold on the victim line.

3. The method for reducing the effect of crosstalk according to claim 1 wherein sensing the occurrence of a voltage change on the aggressor line that can induce a voltage pulse having a pulse magnitude that exceeds a pulse threshold on the victim line further comprises sensing a voltage change on the victim line caused by a voltage change on the aggressor line, wherein the voltage change on the victim line exceeds a pulse threshold.

4. The method for reducing the effect of crosstalk according to claim 1 wherein the aggressor line and the victim line are capacitively coupled.

5. The method for reducing the effect of crosstalk according to claim 1 wherein counteracting the induced voltage pulse by coupling the victim line to a counteracting voltage source further comprises counteracting the induced voltage pulse by connecting the victim line to a counteracting voltage source by switching a transistor to a conductive state to couple the counteracting voltage source to the victim line.

6. The method for reducing the effect of crosstalk according to claim 5 wherein the induced pulse is a positive-going pulse, and wherein connecting the victim line to a counteracting voltage source by switching a transistor to a conductive state further comprises connecting the victim line to a ground voltage source by switching a transistor to a conductive state.

7. The method for reducing the effect of crosstalk according to claim 5 wherein the induced pulse is a negative-going pulse, and wherein connecting the victim line to a counteracting voltage source by switching a transistor to a conductive state further comprises connecting the victim line to a power supply voltage source by switching a transistor to a conductive state.

8. The method for reducing the effect of crosstalk according to claim 1 wherein the predetermined delay period is substantially equal to an amount of time the induced voltage pulse exceeds the pulse threshold.

9. The method for reducing the effect of crosstalk according to claim 1 wherein sensing the occurrence of a voltage change on the aggressor line further comprises sensing a rising voltage transition on the aggressor line that can induce a positive-going voltage pulse having a pulse magnitude that exceeds a pulse threshold on the victim line.

10. The method for reducing the effect of crosstalk according to claim 1 wherein sensing the occurrence of a voltage change on the aggressor line further comprises sensing a falling voltage transition on the aggressor line that can induce a negative-going voltage pulse having a pulse magnitude that exceeds a pulse threshold on the victim line.

11. The method for reducing the effect of crosstalk according to claim 1 further comprising disabling the coupling of the victim line to a counteracting voltage source when the victim line is in a state that is not vulnerable to crosstalk noise of the type counteracted by the counteracting voltage source.

12. The method for reducing the effect of crosstalk according to claim 1 further comprising disabling the coupling of the victim line to a counteracting voltage source when the aggressor line is in a state that cannot cause crosstalk noise of the type counteracted by the counteracting voltage source.

* * * * *